United States Patent
Yoshimochi

(10) Patent No.: US 8,390,041 B2
(45) Date of Patent: Mar. 5, 2013

(54) HIGH EFFICIENCY MODULE

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 176 days.

(21) Appl. No.: 12/672,437

(22) PCT Filed: Aug. 1, 2008

(86) PCT No.: PCT/JP2008/063849
§ 371 (c)(1),
(2), (4) Date: Feb. 5, 2010

(87) PCT Pub. No.: WO2009/020061
PCT Pub. Date: Feb. 12, 2009

(65) Prior Publication Data
US 2011/0096509 A1 Apr. 28, 2011

(30) Foreign Application Priority Data
Aug. 7, 2007 (JP) .................................. 2007-205358

(51) Int. Cl.
*H01L 29/76* (2006.01)
*H01L 21/00* (2006.01)
*H01R 9/00* (2006.01)

(52) U.S. Cl. ............... 257/288; 257/693; 257/E23.031; 257/E23.043; 257/E23.052; 257/E23.141; 361/772; 361/813; 438/123; 438/127

(58) Field of Classification Search .................. None
See application file for complete search history.

(56) References Cited

U.S. PATENT DOCUMENTS

| 2003/0075785 A1* | 4/2003 | Crowley et al. ............... 257/676 |
| 2005/0224945 A1* | 10/2005 | Saito et al. ..................... 257/686 |
| 2007/0158819 A1* | 7/2007 | Hirashima et al. ............. 257/692 |
| 2007/0166877 A1* | 7/2007 | Otremba ........................ 438/106 |
| 2008/0197463 A1* | 8/2008 | Otremba ........................ 257/676 |
| 2009/0269885 A1* | 10/2009 | Madrid et al. ................. 438/119 |

FOREIGN PATENT DOCUMENTS

| JP | 2002-076195 | 3/2002 |
| JP | 2006-134990 | 5/2006 |

* cited by examiner

*Primary Examiner* — Alonzo Chambliss
(74) *Attorney, Agent, or Firm* — Hamre, Schumann, Mueller & Larson, P.C.

(57) ABSTRACT

A module (1) includes a first functional device (2) and a second functional device (3). The first functional device (2) includes a base electrode, an emitter electrode and a collector electrode. The second functional device (3) includes at least one electrode. The module (1) further includes a conductive frame (4). One of the base electrode, the emitter electrode, and the collector electrode of the first functional device (2) is directly connected to the frame (4). The electrode of the second functional device (3) is also directly connected to the frame (4). The frame (4) includes a portion serving as a terminal for external connection.

7 Claims, 7 Drawing Sheets

HIGH EFFICIENCY MODULE

TECHNICAL FIELD

The present invention relates to a module with reduced wiring inductance and resistance between mutually connected functional devices.

BACKGROUND ART

A synchronous rectification type DC-DC converter that includes a metal oxide semiconductor field effect transistor (MOSFET) in place of a rectifying diode is known. FIG. 13 is a schematic diagram showing the configuration of a synchronous rectification type DC-DC converter. The illustrated DC-DC converter 100 includes a high-side MOSFET 110, a low-side MOSFET 120, a Schottky barrier diode (SBD) 130, a coil 140, a capacitor 150, and a control IC 160. The DC-DC converter 100 is controlled by the control IC 160 so as to alternately supply current to the high-side MOSFET 110 and the low-side MOSFET 120, to reduce the voltage.

The conventional DC-DC converter 100 is made by mounting the foregoing functional devices on a printed circuit board, and then electrically connecting the electrodes of each functional device via wiring formed on the printed circuit board.

The internal structure of the high-side MOSFET 110 may be made like a MOSFET described in patent document 1 below. In that case, the high-side MOSFET 110 is configured as shown in FIG. 14. Specifically, the high-side MOSFET 110 includes a MOSFET chip 111, a frame 112, a gate terminal 110a, a source terminal 110b, and a drain terminal 110c. The gate electrode and the source electrode of the MOSFET chip 111 are connected directly to the gate terminal 110a and the source terminal 110b, respectively. The drain electrode is connected to the drain terminal 110c through the frame 112. The low-side MOSFET 120 may be configured in a similar manner.

Patent Document 1: JP-A-2002-76195

As stated above, in the conventional DC-DC converter 100, the functional devices are electrically connected through the wiring formed on the printed circuit board. Generally, the wiring formed on the printed circuit board has certain wiring resistance and inductance. The wiring resistance is proportional to the length of the wiring, and inversely proportional to the cross-sectional area thereof. The wiring inductance is substantially proportional to the length of the wiring. Even if the high-side MOSFET 110 and the low-side MOSFET 120 are mounted adjacently on the printed circuit board, there is a limit to the reducible amount of the resistance and the inductance of the wiring between the source terminal 110b of the high-side MOSFET 110 and the drain terminal 120c of the low-side MOSFET 120.

The wiring resistance leads to an increase in power consumption of the DC-DC converter 100, and the wiring inductance leads to deterioration of switching performance of the DC-DC converter 100. In addition, the wiring inductance may cause electromagnetic interference (EMI). Specifically, the wiring inductance generates a magnetic field, and when the magnetic field fluctuates, noise is generated in the circuit. Such noise degrades the performance of the DC-DC converter 100.

Further, the frames 112, 122 provided inside the respective MOSFETs 110, 120 also have the wiring resistance and the wiring inductance. This makes the foregoing issue more serious. In particular, when the DC-DC converter 100 is used for high-frequency applications, the influence of the wiring inductance becomes greater.

DISCLOSURE OF THE INVENTION

The present invention has been proposed under the foregoing circumstances. An object of the present invention is to provide a module with reduced wiring resistance and reduced wiring inductance.

To achieve the object, the present invention takes the following technical measures.

The present invention provides a module comprising: a first functional device including a base electrode, an emitter electrode and a collector electrode; a second functional device including at least one electrode; and a frame directly connected to both the electrode of the second functional device and one of the base electrode, the emitter electrode and the collector electrode. The frame includes a portion serving as a connection terminal.

The above arrangement contributes to reducing the wing resistance and inductance between the functional devices, compared with an instance where the first functional device and the second functional device are connected through an interconnection line formed on a printed circuit board. Accordingly, a circuit including such a module can achieve lower power consumption and higher performance. In addition, the portion of the frame serving as the connection terminal can be used for making a connection to another device on the circuit, which allows the user a higher degree of freedom in designing the circuit.

In a preferred embodiment, the second functional device may include a base electrode, an emitter electrode, and a collector electrode.

Also in the above case, where the two functional devices are both transistors, it is possible to reduce the wiring resistance and inductance between the electrodes directly connected to the frame.

In a preferred embodiment, the first functional device and the second functional device may be as arranged to face each other across the frame.

Such configuration minimizes the distance between the electrodes directly connected to the frame, thereby further reducing the wiring resistance and inductance.

Preferably, the collector electrode of the first functional device and the emitter electrode of the second functional device are directly connected to the frame.

Such configuration enables reduction in wiring resistance and inductance between the collector electrode of the first functional device and the emitter electrode of the second functional device.

Other features and advantages of the present invention will become more apparent through the following detailed description given with reference to the accompanying drawings.

BEST MODE FOR CARRYING OUT THE INVENTION

Figure 1:
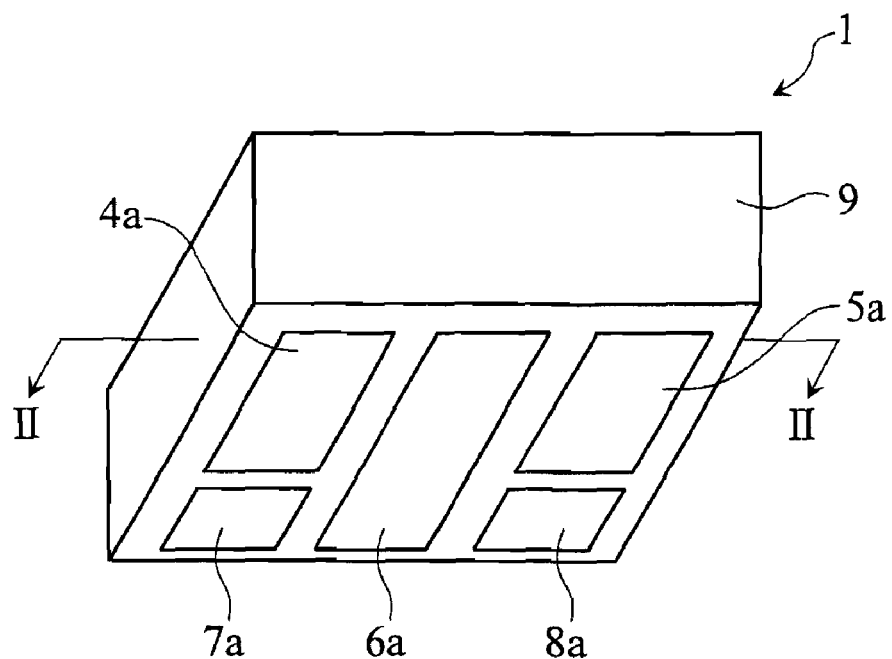
FIG. 1 is a perspective view showing a module according to a first embodiment of the present invention.
Figure 2:
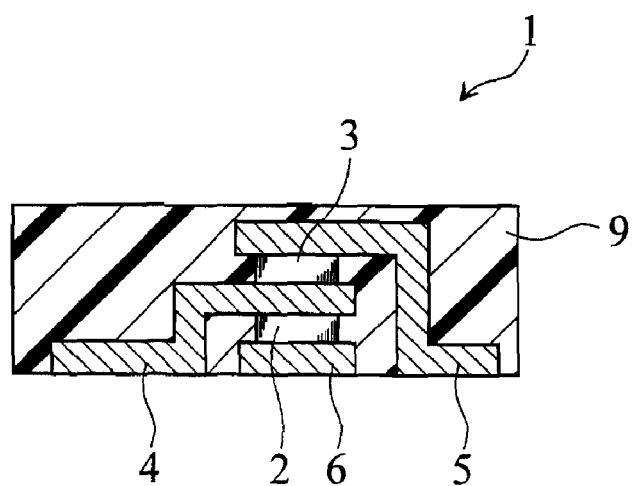
FIG. 2 is a cross-sectional view taken along a line II-II in FIG. 1.
Figure 3:
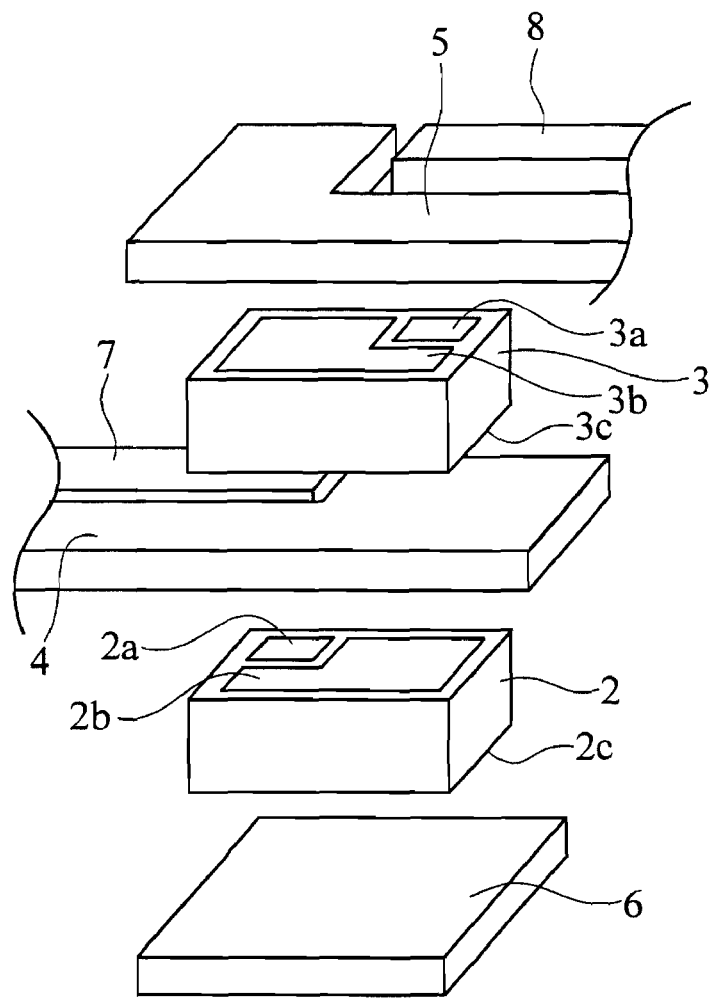
FIG. 3 is an exploded perspective view showing main portions of the module according to the first embodiment.
Figure 13:
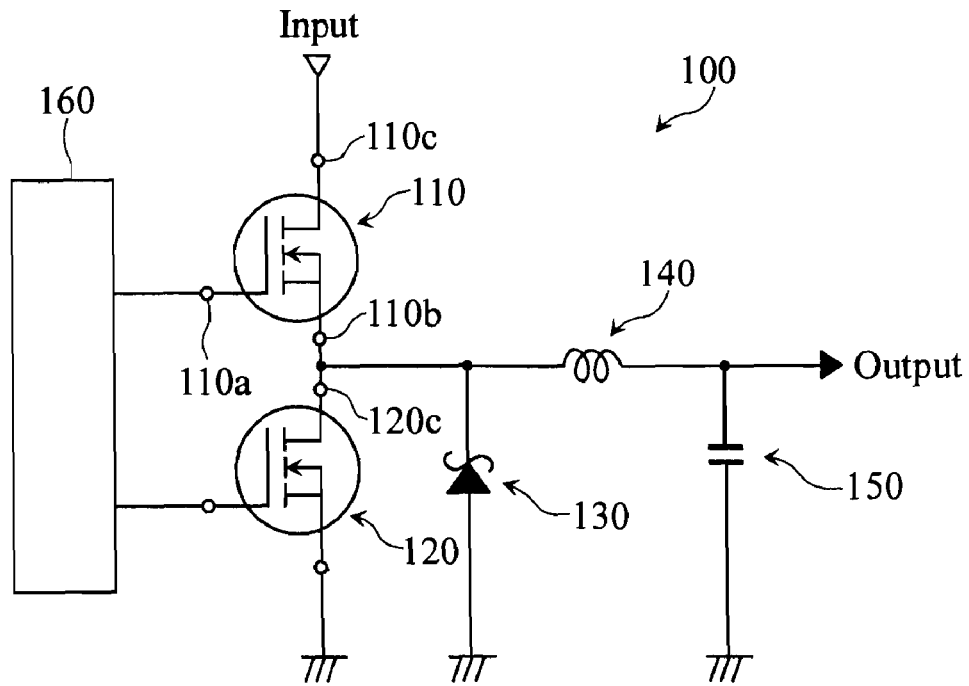
FIG. 13 is a circuit diagram of a synchronous rectification type DC-DC converter.
Figure 14:
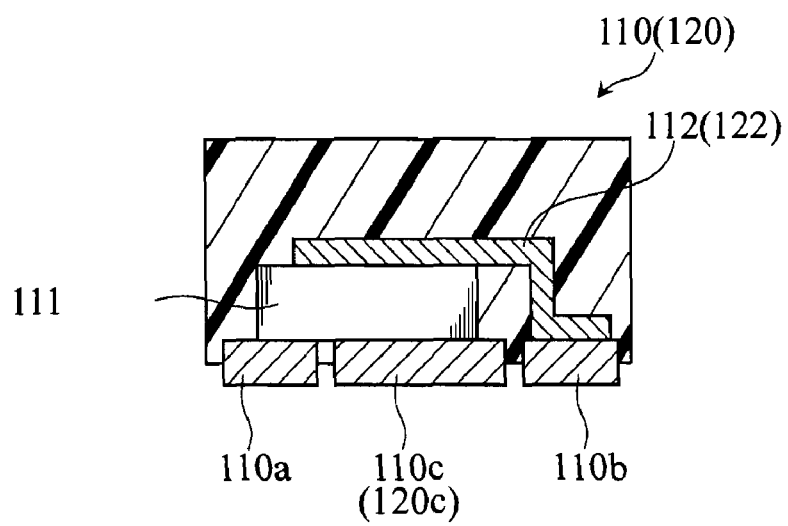
FIG. 14 is a cross-sectional view for explaining the structure of a conventional MOSFET.

Embodiments of the present invention will be described below with reference to the accompanying drawings. FIGS. 1 to 3 illustrate a module according to a first embodiment of the present invention. The module of this embodiment corresponds to a single device into which the high-side MOSFET 110 and the low-side MOSFET 120 shown in FIG. 13 are integrated.

The illustrated module 1 includes a high-side MOSFET chip 2, a low-side MOSFET chip 3, conductive lead frames 4-8, and a resin package 9.

As shown in FIG. 3, the upper surface of the high-side MOSFET chip 2 is provided with a gate electrode 2a and a source electrode 2b, and the lower surface of the chip is provided with a drain electrode 2c. As known, a bipolar transistor has three electrodes called a base electrode, an emitter electrode, and a collector electrode. These electrodes correspond to the gate electrode, the source electrode, and the drain electrode of a MOSFET, respectively.

The gate electrode 2a of the high-side MOSFET chip 2 is connected to the frame 7, the source electrode 2b to the frame 4, and the drain electrode 2c to the frame 6. Thus, the high-side MOSFET chip 2 is interposed between the upper-side frames 4, 7 and the lower-side frame 6.

The upper surface of the low-side MOSFET chip 3 is provided with a gate electrode 3a and a source electrode 3b, and the lower surface of the chip is provided with a drain electrode 3c.

The gate electrode 3a of the low-side MOSFET chip 3 is connected to the frame 8, the source electrode 3b to the frame 5, and the drain electrode 3c to the frame 4. Thus, the low-side MOSFET chip 3 is interposed between the upper-side frames 5, 8 and the lower-side frames 4, 7. The drain electrode 3c of the low-side MOSFET chip 3 is so located as not to be connected to the frame 7. The electrodes 2a-2c, 3a-3c are attached to the corresponding frames 4-8 with solder or conductive paste, for example.

The frames 4-8 are made of metal such as copper, and electrically connected to the electrodes of the chips 2 and 3. As shown in FIG. 2, the frames 4, 5 are generally S-shaped in cross section, and one end portions of the respective frames serve as connection terminals of the module 1. As shown in FIG. 3, the other end portions of the respective frames 4, 5 are L-shaped. The frames 7, 8 are also generally S-shaped in cross section like the frames 4, 5, though not shown in FIG. 2, and one end portions of the respective frames serve as connection terminals of the module 1. The frame 6 has a lower surface serving as a connection terminal of the module 1.

As shown in FIG. 3, the lower surface of the other end portion of the frame 4 is connected to the source electrode 2b of the high-side MOSFET chip 2. Also, the upper surface of the other end portion of the frame 4 is connected to the drain electrode 3c of the low-side MOSFET chip 3. Thus, the frame 4 is located such that the other end portion is interposed between the upper surface of the high-side MOSFET chip 2 and the lower surface of the low-side MOSFET chip 3.

The lower surface of the other end portion of the frame 5 is connected to the source electrode 3a of the low-side MOSFET chip 3. The upper surface of the frame 6 is connected to the drain electrode 2c of the high-side MOSFET chip 2. The lower surface of the other end portion of the frame 7 is connected to the gate electrode 2a of the high-side MOSFET chip 2. The lower surface of the other end portion of the frame 8 is connected to the gate electrode 3a of the low-side MOSFET chip 3.

As shown in FIG. 1, the lower surface of an end portion of the frame 4 serves as an output terminal 4a of the module 1. The lower surface of an end portion of the frame 5 serves as a ground terminal 5a of the module 1. The lower surface of the frame 6 serves as an input terminal 6a of the module 1. The lower surface of an end portion of the frame 7 serves as a control terminal 7a of the high-side MOSFET chip 2 of the module 1. The lower surface of an end portion of the frame 8 serves as a control terminal 8a of the low-side MOSFET chip 3 of the module 1.

The resin package 9 encloses the chips 2-3 and the frames 4-8. The resin package 9 may be formed by molding. In this process, the chips 2-3 and the frames 4-8 are disposed immovably at the predetermined positions noted above, and placed in a metal mold for forming the resin package 9. Then, a molten resin material for the resin package 9 is supplied to fill up the mold. By hardening the resin material, the resin package 9 shown in FIGS. 1 and 2 can be obtained.

The operation of the module 1 will now be described.

The control terminal 7a and the control terminal 8a of the module 1 receive a pulse signal from the control IC 160 (see FIG. 13). The pulse signal inputted to the control terminal 8a has inverted high and low levels with respect to the pulse signal inputted to the control terminal 7a. Accordingly, when a high level voltage is inputted to the control terminal 7a, a low level voltage is inputted to the control terminal 8a, and when a low level voltage is inputted to the control terminal 7a, a high level voltage is inputted to the control terminal 8a.

When the high level voltage is applied to the control terminal 7a, the high-side MOSFET chip 2 is in electrical conduction state, while the low-side MOSFET chip 3 is not. Hence, the current inputted to the input terminal 6a is outputted from the output terminal 4a. The current thus outputted charges magnetic energy in the coil 140 and electric energy in the capacitor 150, and is outputted from the DC-DC converter 100.

When the low level voltage is applied to the control terminal 7a, the low-side MOSFET chip 3 is in electrical conduction state, while the high-side MOSFET chip 2 is not. Hence, the current inputted to the input terminal 6a is not outputted from the output terminal 4a. In this case, the magnetic energy stored in the coil 140 and the electric energy stored in the capacitor 150 are discharged and outputted from the DC-DC converter 100.

In the DC-DC converter 100, the control IC 160 adjusts the duty ratio of pulse signals inputted to the control terminals 7a and 8*a* (ratio of the high level duration to one period of the pulse signal), to output the required voltage.

Advantages of the module 1 will be described below.

In the embodiment above, the source electrode 2*b* of the high-side MOSFET chip 2 and the drain electrode 3*c* of the low-side MOSFET chip 3 are connected in a mutually facing manner across the frame 4. Accordingly, the length of the connection path between the electrodes 2*b*, 3*c* is equal to the thickness of the frame 4, and the cross-sectional area of the connection path is equal to the area of the electrodes 2*b*, 3*c*. Such configuration reduces the wiring resistance and inductance between the electrodes 2*b*, 3*c*.

Thus, by using the module 1, whose wiring resistance is reduced, it is possible to reduce power consumption of the DC-DC converter 100 (FIG. 13). Also, since the wiring inductance is reduced, the switching performance of the DC-DC converter 100 can be improved. Further, the EMI can be suppressed, so that the DC-DC converter 100 can exhibit higher performance.

Also, in the above embodiment, a portion of the frame 4 itself serves as the output terminal 4*a*. In this manner, a current from the connection point between the source electrode 2*b* of the high-side MOSFET chip 2 and the drain electrode 3*c* of the low-side MOSFET chip 3 can be directly outputted from the terminal. Thus, the module 1 can constitute the DC-DC converter 100.

In the above embodiment, the module 1 is described as being used for providing a synchronous rectification type DC-DC converter. It should be noted that the module 1 can enjoy the same advantages when applied to other circuits (for example, a power supply circuit or a motor drive circuit). The structure of the module is not limited to that of the above embodiment. Modules according to second through fifth embodiments will be described below.

Figure 4:
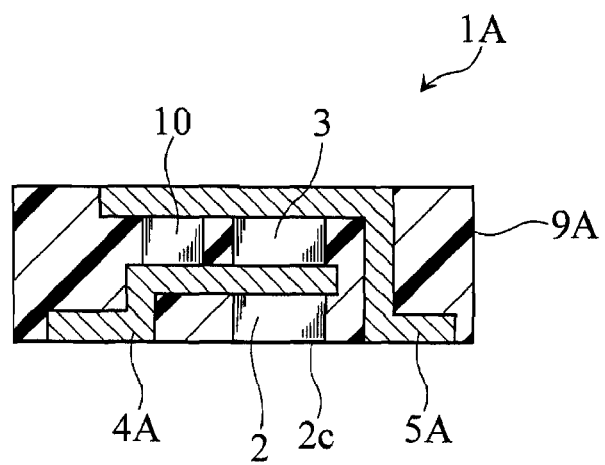
FIG. 4 is a cross-sectional view of a module according to a second embodiment of the present invention.

FIG. 4 depicts a module according to the second embodiment of the present invention. The module 1A according to this embodiment is different from the module according to the first embodiment in the following three aspects. First, a frame 5A is exposed at the upper surface of the module 1A. Second, the drain electrode 2*c* of the high-side MOSFET chip 2 is exposed at the lower surface of the module 1A, so as to serve also as an input terminal. Third, a SBD chip 10 (corresponding to the SBD130 in FIG. 13) is provided between the frame 4A and the frame 5A. The SBD chip 10 has an upper surface and a lower surface, provided with an anode electrode and a cathode electrode, respectively. In FIG. 4, the anode electrode of the SBD chip 10 is connected to the lower surface of the frame 5A, and the cathode electrode to the upper surface of the frame 4A.

The second embodiment also enjoys the same advantages as the first embodiment. Further, in the second embodiment, a heat dissipation plate (not shown) may be attached to the exposed surface of the frame 5A, so as to release heat efficiently. Also, since the frame 6 of the first embodiment is not needed in the second embodiment, the production cost can be reduced. Further, the module 1A of the second embodiment includes the MOSFET chip 2, 3 and the SBD chip 10 in a single package 9A. Thus, the number of parts necessary for constituting the DC-DC converter 100 can be reduced.

In the module 1A, the chip located between the frame 4A and the frame 5A may be another diode chip or a passive element such as a resistor, in place of the SBD chip. Also, the diode chip or the passive element chip may be located on the lower surface of the frame 4A, with an electrode of the chip connected to the frame 4A. In this instance, the other electrode of the chip may serve as a terminal exposed at the lower surface of the module 1A.

Figure 5:
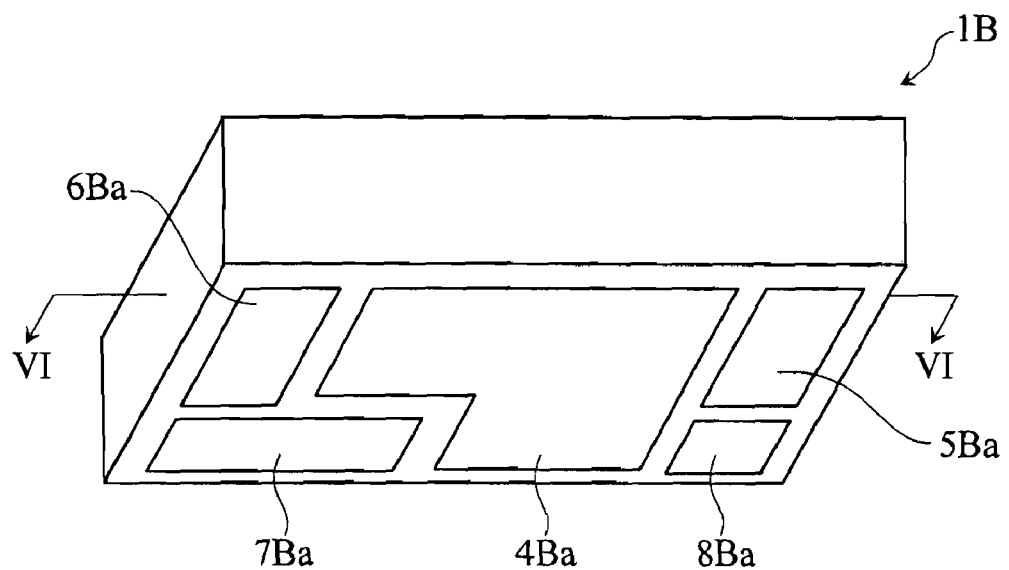
FIG. 5 is a perspective view showing a module according to a third embodiment of the present invention.
Figure 6:
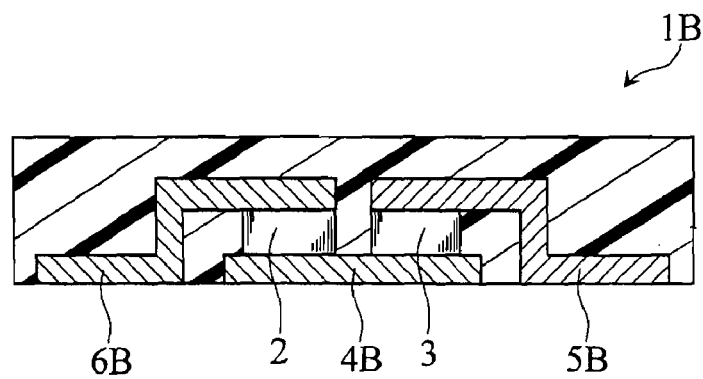
FIG. 6 is a cross-sectional view taken along a line VI-VI in FIG. 5.
Figure 7:
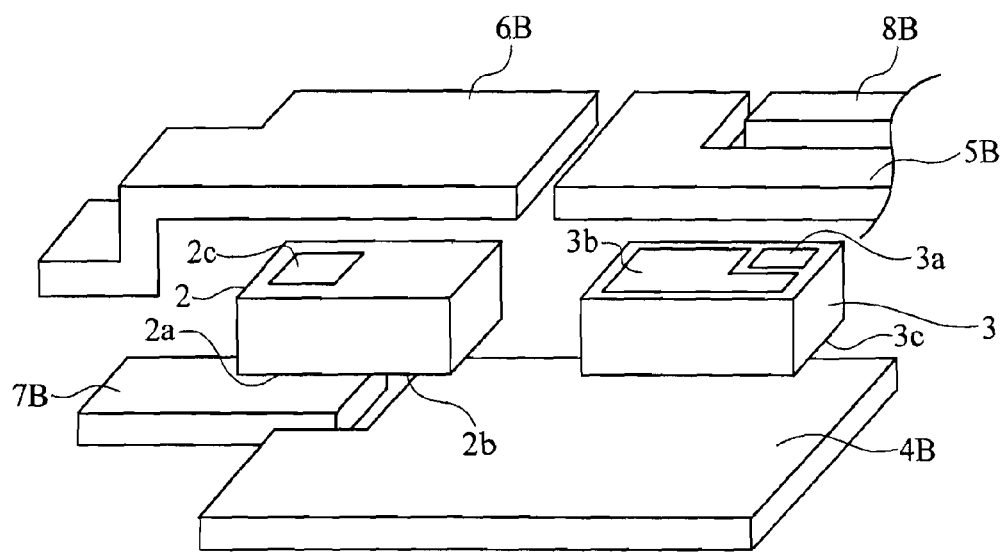
FIG. 7 is an exploded perspective view showing main portions of the module according to the third embodiment.

FIGS. 5-7 depict a module according to the third embodiment of the present invention. The module 1B of this embodiment is different from the module 1 of the first embodiment in that the high-side MOSFET chip 2 and the low-side MOSFET chip 3 are located side by side on the upper surface of the frame 4B, as shown in FIGS. 6 and 7. Also, since the chips 2, 3 are located side by side in the module 1B, the shape and location of the frames 4B-8B (see FIG. 7), as well as the shape and location of terminals 4Ba-8Ba provided on the lower surface of the module 1B are different from those of the first embodiment.

In the third embodiment, the source electrode 2*b* of the high-side MOSFET chip 2 and the drain electrode 3*c* of the low-side MOSFET chip 3 are connected through a conductive path that is smaller in length and greater in cross-sectional area than the conventional wiring formed on a printed circuit board. Thus, the third embodiment can enjoy the same advantages as those of the first embodiment. Also, in the third embodiment, the module 1B can have a smaller thickness (the vertical dimension in FIG. 6) than the module 1 of the first embodiment.

In the foregoing embodiment, the source electrode 2*b* of the high-side MOSFET chip 2 and the drain electrode 3*c* of the low-side MOSFET chip 3 are connected, though the present invention is not limited to this configuration. For example, the gate electrode of one MOSFET chip and the source electrode of the other MOSFET chip can be connected, with reduced wiring resistance and inductance between the two electrodes. Thus, in this case again, the foregoing advantages can be enjoyed.

In the foregoing embodiments, the functional devices constituting the modules are MOSFET chips, though the present invention is not limited to this. The same advantages can be enjoyed by using transistors other than MOSFETs, or diodes, or passive elements such as resistors, or a combination thereof.

Figure 8:
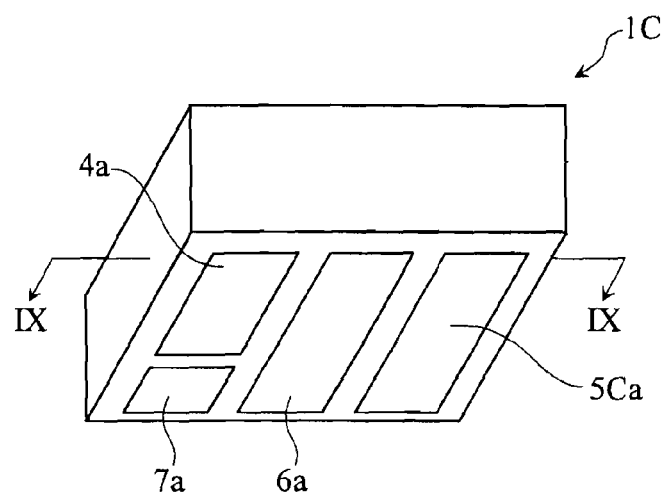
FIG. 8 is a perspective view showing a module according to a fourth embodiment of the present invention.
Figure 9:
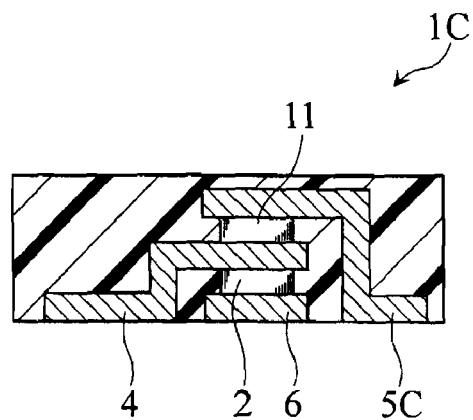
FIG. 9 is a cross-sectional view taken along a line IX-IX in FIG. 8.
Figure 10:
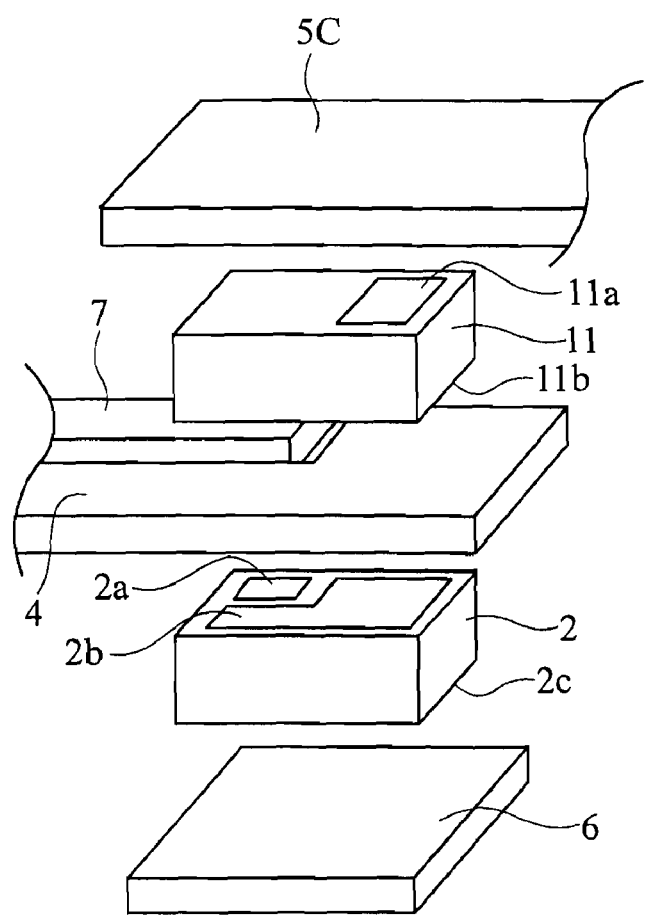
FIG. 10 is an exploded perspective view showing main portions of the module according to the fourth embodiment.

FIGS. 8 to 10 depict a module according to the fourth embodiment of the present invention. The module 1C of this embodiment differs from the module 1 of the first embodiment (see FIGS. 2 and 3) in that a diode chip 11 is used in place of the low-side MOSFET chip 3 in the module 1. The diode chip 11 includes an anode electrode and a cathode electrode provided on two opposite surfaces, respectively. In FIG. 10, the anode electrode 11*a* is arranged on the upper surface, and the cathode electrode 11*b* is arranged on the lower surface. The module 1C also differs from the module of the first embodiment in the shape of the frame 5C (see FIG. 10) and the shape of a terminal 5Ca (see FIG. 5) provided on the lower surface of the module 1C.

Figure 11:
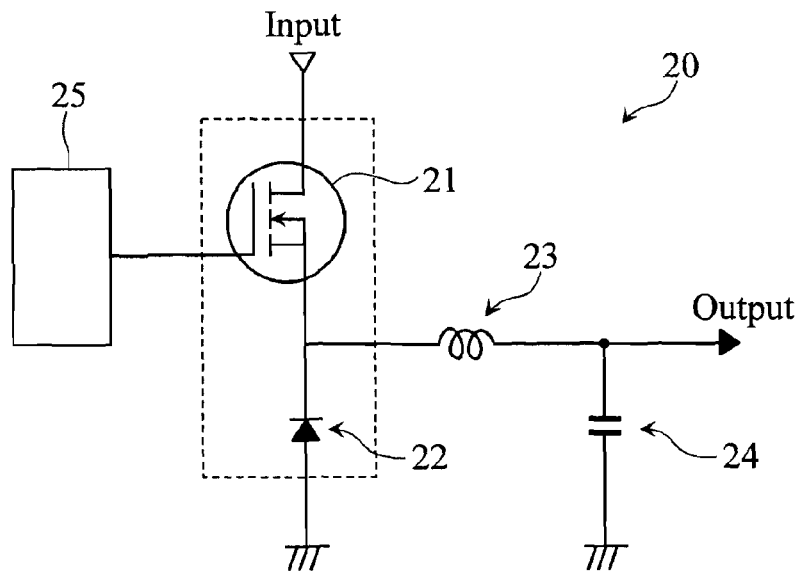
FIG. 11 is a circuit diagram of a step down DC-DC converter.

FIG. 11 is a circuit diagram of a step down DC-DC converter. The step down DC-DC converter 20 includes a MOSFET 21, a diode 22, a coil 23, a capacitor 24, and a control IC 25. In the step down DC-DC converter 20, the MOSFET 21 is brought into intermittent electrical conduction under the control of the control IC 25, thereby lowering the inputted voltage to a predetermined level before the voltage is outputted.

By using the module 1C of the fourth embodiment for the MOSFET 21 and the diode 22 of the step down DC-DC converter 20 shown in FIG. 11 (indicated by dotted lines in FIG. 11), the wiring resistance and inductance between the source electrode of the MOSFET 21 and the cathode electrode of the diode 22 can be reduced. This enables reduction in power consumption and improvement in performance of the step down DC-DC converter 20.

A module according to the fifth embodiment of the present invention differs from the module 1 of the first embodiment (see FIG. 2) in that an NPN transistor and a PNP transistor are employed in place of the high-side MOSFET chip 2 and the low-side MOSFET chip 3, respectively. Drawings to illustrate the fifth embodiment are omitted since they would be the same as FIGS. 1-3.

Figure 12:
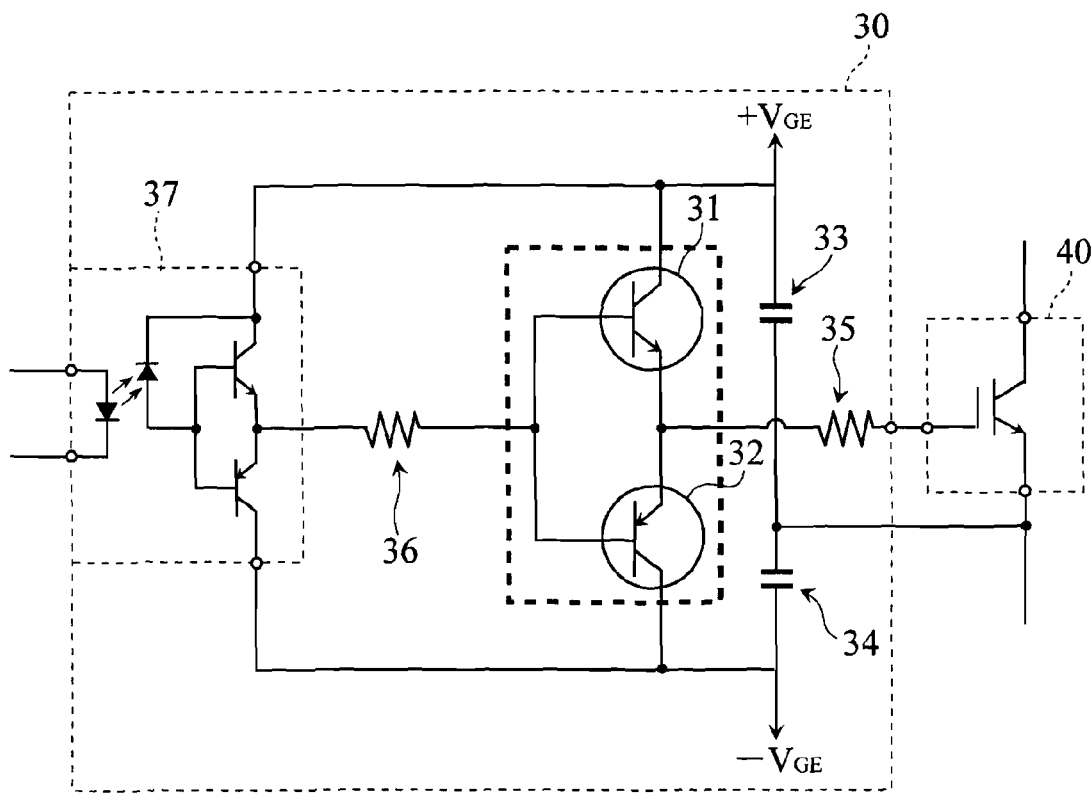
FIG. 12 is a circuit diagram of a drive circuit.

FIG. 12 is a circuit diagram of a drive circuit. A drive circuit 30 includes an NPN transistor 31, a PNP transistor 32, capacitors 33, 34, a gate resistance 35, a resistance 36, and a high-speed photocoupler 37. The drive circuit 30 provides, based on a signal inputted to the high-speed photocoupler 37, an amplified signal to the gate terminal of an IGBT 40 serving as the switching element, and drives the IGBT 40.

Specifically, when the pulse signal inputted to the high-speed photocoupler 37 is of a high level, the NPN transistor 31 is in electrical conduction, so that a voltage $+V_{GE}$ is applied to the gate terminal of the IGBT 40. On the other hand, when the pulse signal inputted to the high-speed photocoupler 37 is of a low level, the PNP transistor 32 is in electrical conduction, so that a voltage $-V_{GE}$ is applied to the gate terminal of the IGBT 40. In this manner, the signal inputted to the high-speed photocoupler 37 is amplified and inputted to the gate terminal of the IGBT 40.

By using the module of the fifth embodiment for the NPN transistor 31 and the PNP transistor 32 of the drive circuit 30 shown in FIG. 12 (indicated by bold dotted lines in FIG. 12), the wiring resistance and inductance between the emitter electrode of the NPN transistor 31 and the emitter electrode of the PNP transistor 32 can be reduced. This enables reduction in power consumption and improvement in performance of the drive circuit 30.

The invention claimed is:

1. A module comprising:
   a first transistor and a second transistor including a first common surface and a second common surface, respectively, each of the first transistor and the second transistor further including a first electrode, a second electrode and a third electrode, the first and second electrodes of the first transistor being disposed at the first common surface of the first transistor, the first and second electrodes of the second transistor being disposed at the second common surface of the second transistor;
   a frame directly connected to both the third electrode of the first transistor and the second electrode of the second transistor, the frame being disposed between the first transistor and the second transistor; and
   a resin package covering the first transistor, the second transistor and the frame, the resin package including a mounting surface facing in a first direction;
   wherein the frame includes a portion exposed at the mounting surface of the resin package and facing an outside of the resin package, the portion serving as a connection terminal,
   wherein each of the first electrode of the first transistor, the second electrode of the first transistor, the first electrode of the second transistor, and the second electrode of the second transistor faces in a second direction opposite the first direction, and
   wherein the third electrode of the second transistor is exposed at the mounting surface to the outside.

2. The module according to claim 1, wherein the first transistor and the second transistor are arranged to face each other across the frame.

3. The module according to claim 1, wherein each of the first transistor and the second transistor is a bipolar transistor, each of the first electrodes being a base electrode, each of the second electrodes being an emitter electrode, each of the third electrodes being a collector electrode.

4. The module according to claim 1, wherein each of the first transistor and the second transistor is a metal oxide semiconductor field effect transistor (MOSFET), each of the first electrodes being a gate electrode, each of the second electrodes being a source electrode, each of the third electrodes being a drain electrode.

5. The module according to claim 1, further comprising an additional frame connected to the third electrode of the second transistor.

6. The module according to claim 1, further comprising a Schottky barrier diode connected to the frame.

7. The module according to claim 6, wherein the Schottky barrier diode includes a cathode electrode connected to the frame.

* * * * *